United States Patent
Baker et al.

(10) Patent No.: US 6,670,283 B2
(45) Date of Patent: Dec. 30, 2003

(54) BACKSIDE PROTECTION FILMS

(75) Inventors: Faye D. Baker, Burlington, VT (US); Casey J. Grant, Hinesburg, VT (US); Mousa H. Ishaq, Essex Junction, VT (US); Joel M. Sharrow, South Hero, VT (US); James D. Weil, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/989,389

(22) Filed: Nov. 20, 2001

(65) Prior Publication Data

US 2003/0096507 A1 May 22, 2003

(51) Int. Cl.[7] .................... H01L 21/31; H01L 21/469
(52) U.S. Cl. .................... 438/758; 438/689; 438/679
(58) Field of Search .................... 438/663, 679, 438/680, 691, 697, 689, 704, 706, 733, 734, 735, 738, 740, 745, 758, 778, 779

(56) References Cited

U.S. PATENT DOCUMENTS

| 4,053,335 | A |   | 10/1977 | Hu |   |
|---|---|---|---|---|---|
| 4,687,682 | A |   | 8/1987 | Koze |   |
| 5,006,202 | A | * | 4/1991 | Hawkins et al. | 156/644 |
| 5,201,987 | A | * | 4/1993 | Hawkins et al. | 156/633 |
| 5,296,385 | A |   | 3/1994 | Moslehi et al. |   |
| 5,562,770 | A |   | 10/1996 | Chen et al. |   |
| 5,856,230 | A |   | 1/1999 | Jang |   |
| 6,017,828 | A |   | 1/2000 | Liao et al. |   |
| 6,153,536 | A | * | 11/2000 | Brouillette et al. | 438/758 |
| 6,180,318 | B1 | * | 1/2001 | Fitzer et al. | 430/292 |

FOREIGN PATENT DOCUMENTS

| EP | 1 089 328 | 4/2001 |
|---|---|---|
| JP | 9052797 | 2/1997 |
| JP | 9052798 | 2/1997 |

* cited by examiner

Primary Examiner—David Nhu
(74) Attorney, Agent, or Firm—Schmeiser, Olsen & Watts; William D. Sabo

(57) ABSTRACT

Disclosed is a method of fabricating a semiconductor device, comprising: (a) providing a bare semiconductor substrate, the substrate having a frontside and a backside; (b) forming one or more protective films on the backside of the substrate; and (c) performing one or more wafer fabrication steps. Some or all the protective films may be removed and the method repeated multiple times during fabrication of the semiconductor device.

20 Claims, 7 Drawing Sheets

BACKSIDE PROTECTION FILMS

FIELD OF THE INVENTION

The present invention relates to the field of semiconductor manufacturing; more specifically, it relates to a method of protecting the backside surface of semiconductor substrates.

BACKGROUND OF THE INVENTION

In the manufacture of semiconductor devices, semiconductor substrates, most notably, silicon wafers, are subjected a wide variety of process steps during formation of devices on the frontside of the substrate. These process steps include forming process films, etching process films, etching the substrate itself and placing dopants into the substrate to name a few. During these processes, it is important to protect and/or seal the backside of the substrate from damage or contamination. For example, mechanical damage to the backside or formation of rails on the backside during frontside only film formation can affect photolithographic processes, the backside of the substrate can become contaminated and then contaminate the frontside of the adjacent substrate or backside charging can occur, leading to defective or inoperable devices.

With many traditional film formation tools, process films are formed on the backside of the substrate as a by-product to frontside film formation. These incidentally formed backside films are used to protect or seal the backside of the substrate.

With the advent of frontside only deposition tools such as those used in high-density plasma (HDP) and rapid thermal chemical vapor deposition (RTCVD) tools, incidental backside films are no longer available to protect and/or seal the backside of the substrate. The lack of incidental protective films will create a series of undesirable effects including: inability to remove some process films formed on the backside, inability to prevent or remove backside defects, inability to minimize charging events at subsequent processing steps, attack of the backside of the substrate or backside process films during backside rail removal, and contamination of the backside of the substrate.

Therefore, there is a need to provide purposefully formed backside films at strategic steps in the fabrication processes in order to avoid the undesirable effects cause by the lack of incidental backside films.

SUMMARY OF THE INVENTION

A first aspect of the present invention is a method of fabricating a semiconductor device, comprising: (a) providing a bare semiconductor substrate, the substrate having a frontside and a backside; (b) forming one or more protective films on the backside of the substrate; and (c) performing one or more wafer fabrication steps.

A second aspect of the present invention is method of fabricating a semiconductor device, comprising: (a) providing a bare semiconductor substrate, the substrate having a frontside and a backside; (b) forming a protective film on the frontside and the backside of the substrate; (c) removing the protective film from the frontside of the substrate; and (d) performing one or more wafer fabrication steps.

A third aspect of the present invention is method of fabricating a semiconductor device, comprising: (a) providing a bare semiconductor substrate, the substrate having a frontside and a backside; (b) forming a first protective film on the frontside and the backside of the substrate; (c) forming a second protective film over the first protective film; (d) removing the first and second protective films from the frontside of the substrate; and (e) performing one or more wafer fabrication steps.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
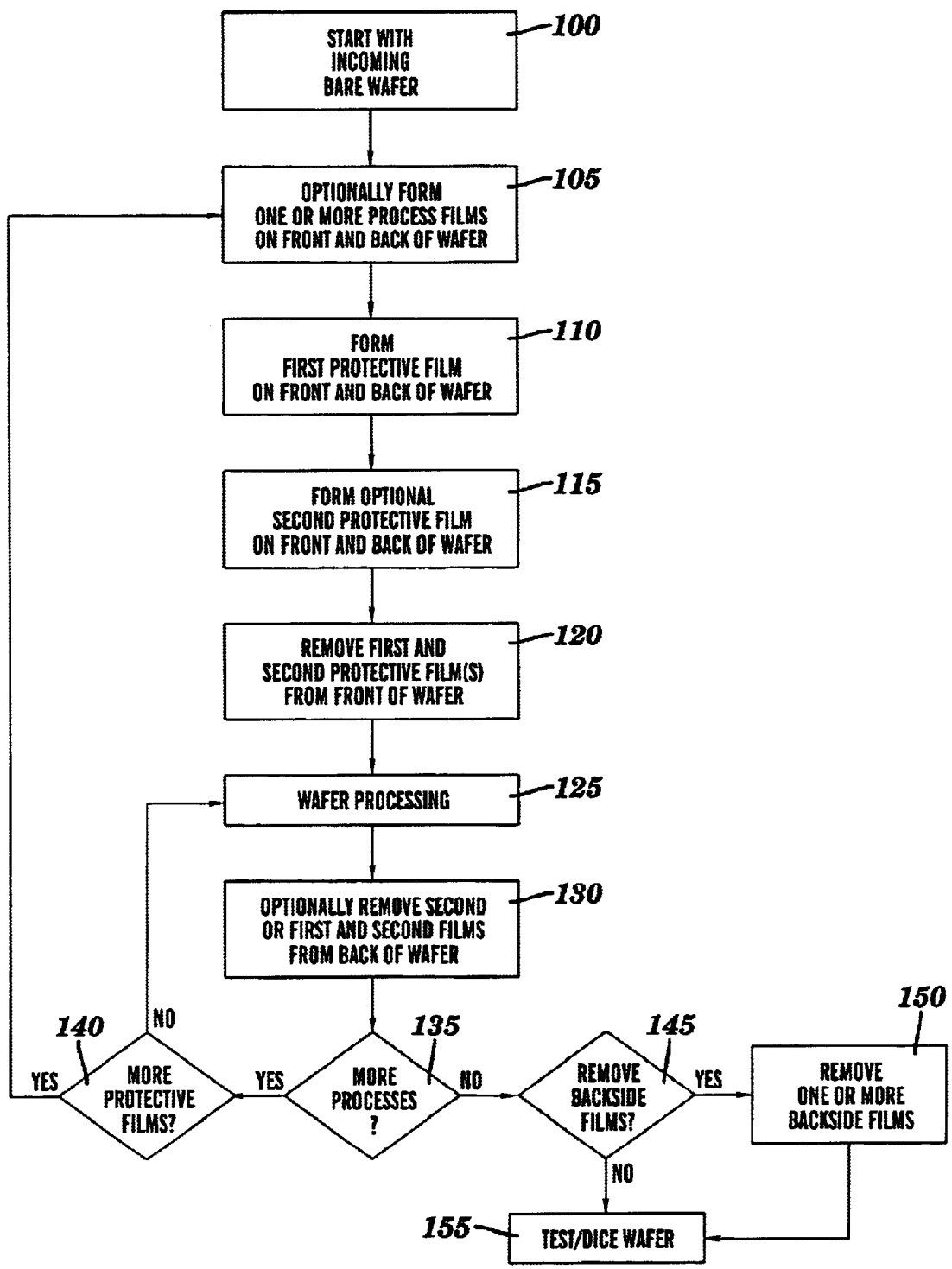
FIG. 1 is a flowchart of the method of providing backside protective films according to the present invention.

FIG. 1 is a flowchart of the method of providing backside protective films according to the present invention. In step 100, a bare semiconductor substrate is provided. In one example, the semiconductor substrate is a silicon wafer. In step 105, one or more process films are formed on the backside and frontside of the wafer. The frontside of the wafer is defined as the side of the wafer on which semiconductor devices and integrated circuits are fabricated. Process films are defined as films formed on the wafer during fabrication of semiconductor devices or integrated circuits as a necessary part of or a by-product of the fabrication process. Step 105 may include surface clean processes. Examples of surface clean processes, well known in the art, include: acid treatments, solvent treatments, chemical oxidation/reduction treatments and etch treatments. Step 105 is an optional step.

In step 110, a first protective film is formed on the frontside and backside of the wafer. Protective films are defined as strategic films that are formed on the wafer solely to protect and/or seal wafer surfaces and/or process films formed on wafer surfaces, from damage, contamination or unwanted removal during the fabrication process. If optional process films are formed on the wafer in step 105, then the first protective film is formed on top of the process films, otherwise the first protective film is formed directly on the frontside and backside surfaces of the wafer. The first protective film may serve one of two purposes depending upon whether the first protective film is used alone or with a second protective film formed on top of the first protective film. If the first protective film is the only protective film then the first protective film is used for protection of the backside of the wafer (or process films formed on the backside of the wafer), against mechanical damage, as a contamination barrier, especially for metallic contamination from wafer chucks, or as a contamination getter, for protection of the backside from frontside etchants, as a diffusion barrier, especially from frontside out-diffusion, or to reduce charging. If the first protective film is used with a second protective film, then the first protective film is used to protect the frontside of the wafer (or process films formed on the frontside of the wafer), from the second protective film, as an adhesion promoter for the second protective film or to allow for removal of the second protective film from the frontside of the wafer. Step 110 may include surface clean processes.

In step 115, an optional second protective film is formed on the frontside and backside of the wafer. The second protective film is used for protection of the backside of the wafer (or process films formed on the backside of the wafer), against mechanical damage, as a contamination barrier, especially for metallic contamination from wafer chucks, or as a contamination getter, for protection of the backside from frontside etchants, as a diffusion barrier, especially from frontside out-diffusion, or to reduce charging. Step 115 may include surface clean processes.

In step 120, the first protective film (and optional second protective film, if one was formed) is removed from the frontside of the wafer. Any process films formed in step 105 are not removed.

In step 125, one or more wafer process steps necessary for fabrication of semiconductor devices is performed. Wafer processing steps include: process film depositions and evaporations, thermal oxidations (forms a process film), ion implants, diffusions, wet and plasma etching, photoresist apply, develop, and strip, photolithography, cleans and anneals. The exact processes performed depend on the design of the semiconductor devices and integrated circuits being fabricated and where in the fabrication sequence the wafer is.

In step 130, the second protective film is optionally removed or both the first and second protective films are optionally removed. In step 135, it is determined if further wafer processing is required. If in step 135 further wafer processing is required it is determined if additional protective films are to be formed on the frontside and backside of the wafer. If in step 140, additional protective films are to be formed, the method loops to step 105, otherwise the method loops to step 125. If in step 135, it is determined no further wafer processing is required then in step 145, it is determined if one or more backside films are to be removed from the backside of the wafer. Backside films are defined as protective films and process films. If in step 145, it is determined that backside films are to be removed then, in step 150 one or more protective films and/or one or more process films are removed. Examples of removal processes include wet and dry etching, chemical-mechanical-polishing (CMP) and grinding. Then, in step 155, the wafer is optionally tested and/or diced into integrated circuit chips or semiconductor devices. If in step 145, it is determined that no backside films are to be removed then the method proceeds to step 155 and the method terminates.

Figure 2A:
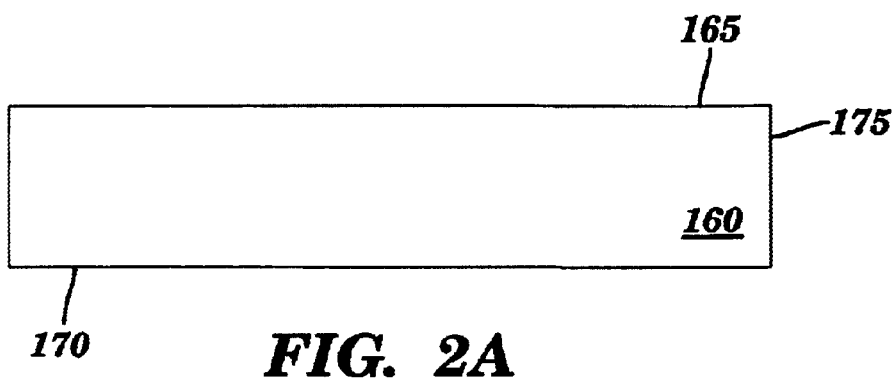
FIGS. 2A through 2D are cross-sectional views of a first embodiment of the present invention.

FIGS. 2A through 2D are cross-sectional views of a first example of the present invention. In FIG. 2A, a bare semiconductor substrate wafer 160 has a frontside 165, a backside 170 and an edge 175.

Figure 2B:
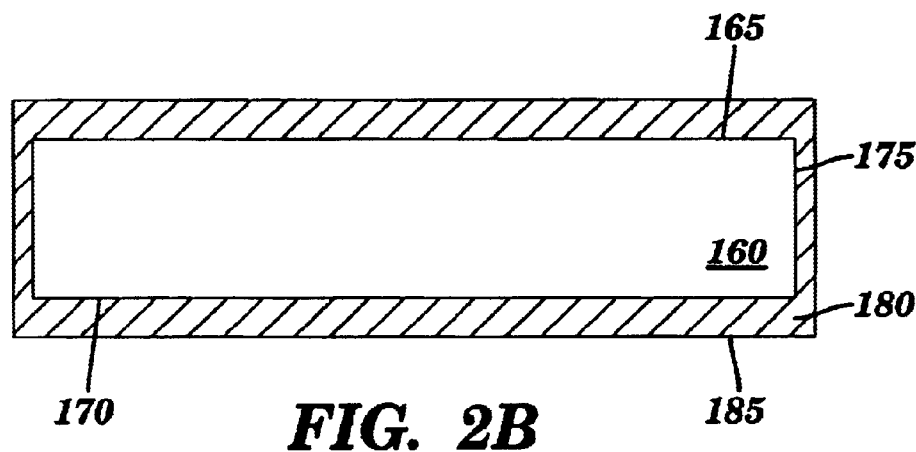

In FIG. 2B, a first protective film 180 is formed on frontside 165, backside 170 and edge 175 of wafer 160. First protective film 180 has a backside outer surface 185 where the first protective film is formed on backside 170 of wafer 160.

Figure 2C:
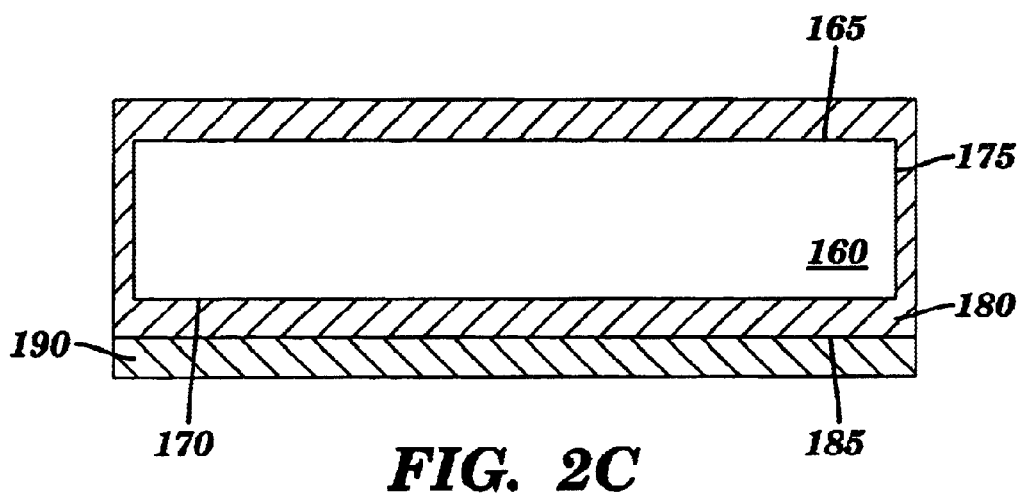

In FIG. 2C, a second protective film 190 is formed on backside outer surface 185 of first protective film 180. In a first example, first protective film 180 is TEOS (tetraethoxysilane) oxide about 50 Å to 7000 Å thick formed using any number of well known chemical vapor deposition (CVD) processes and second protective film 190 is silicon carbide about 350 Å to 5000 Å microns thick formed only on backside outer surface 185 of first protective film 180 using a tool/process such as AMAT Producer for BLOK by AMAT, Santa Clara, Calif. In a second example, first protective film 180 is TEOS oxide about 350 Å to 5000 Å microns thick formed by any well known CVD process and second protective film 190 is dual layer of about 350 Å to 5000 Å of diamond over about 350 Å to 5000 Å of silicon nitride, silicon carbide or silicon formed only on backside outer surface 185 of first protective film 180. At the present state of the technology, diamond is best formed over silicon, silicon nitride or silicon carbide. Diamond may be formed by a plasma enhanced chemical vapor deposition (PECVD) process under low pressure using $H_2$ and $CH_4$ gases using a process offered by P1 Diamond Inc, Santa Clara, Calif. In either example, a thermal oxide may be substituted for TEOS.

Figure 2D:
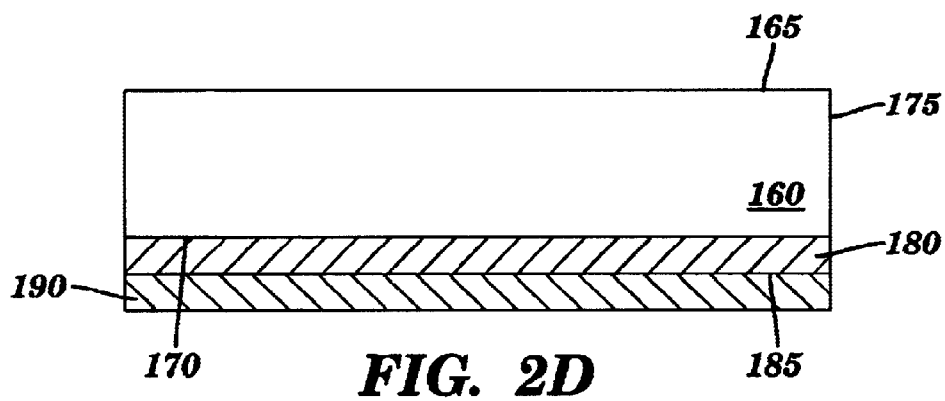

In FIG. 2D, first protective film 180 is removed from frontside 165 and edge 175 of wafer 160 by etching in dilute HF. At this point, one or more wafer processing steps may be performed as illustrated in FIG. 1 and described in step 125 above.

First protective film 180 protects frontside 165 of wafer 160 from mechanical damage during formation of second protective film 190. Second protective film protects backside 170 of wafer 160 from mechanical damage and acts as a diffusion barrier. Since silicon carbide and diamond are impervious to nearly all standard semiconductor wet etches, first protective film 180 sandwiched between second protective film 190 and backside 170 of wafer 160 is maintained during wafer process steps such as HF etches.

The presence of first protective film 180 sandwiched between second protective film 190 and backside 170 of wafer 160 minimizes wafer charging. Second protective film 190 may removed by mechanical means such as CMP or grinding.

Figure 3A:
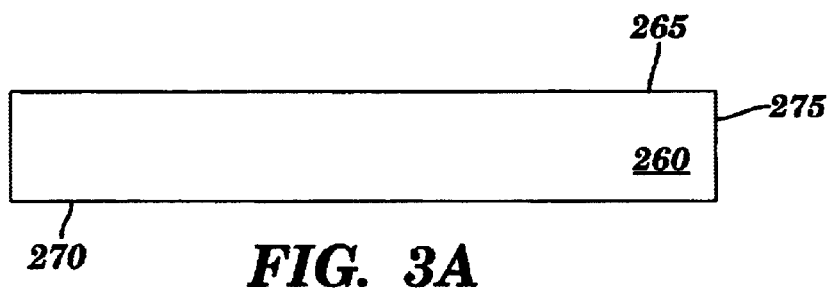
FIGS. 3A through 3E are cross-sectional views of a second example of the present invention.

FIGS. 3A through 3E are cross-sectional views of a second example of the present invention. In FIG. 3A, a bare semiconductor substrate wafer 260 has a frontside 265, a backside 270 and an edge 275.

Figure 3B:
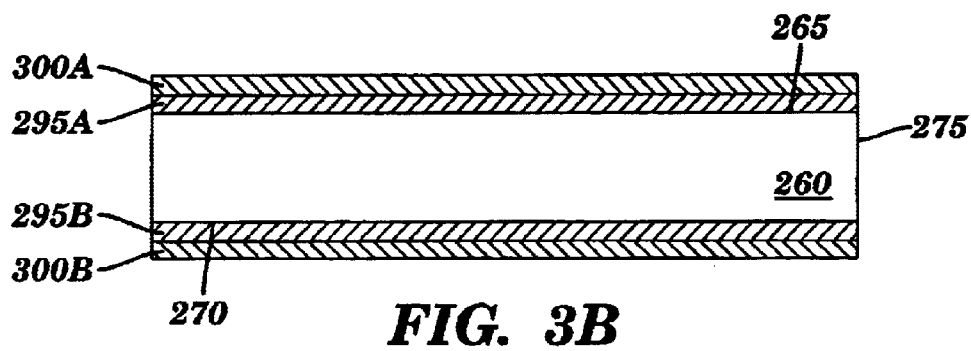

In FIG. 3B, one or more process films are formed on wafer 260. In one example, the process films comprise a frontside pad oxide film 295A formed on frontside 265 and a backside pad oxide film 295B formed on backside 270 of wafer 260 and a frontside pad silicon nitride film 300A formed on frontside pad oxide film 295A and a backside pad silicon nitride layer 300B formed on backside pad oxide film 295B. Frontside and backside pad oxide films 295A and 295B are about 50 Å to 150 Å thick and may be formed by any number of well-known CVD processes. Frontside and backside pad silicon nitride films 300A and 300B are about 700 Å to 1800 Å thick and may be formed by any number of well-known CVD processes.

Figure 3C:
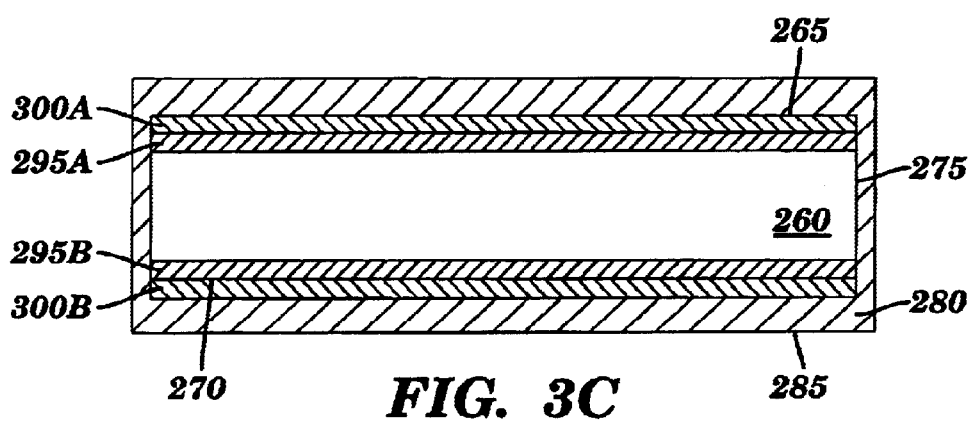

In FIG. 3C, first protective film 280 is formed on frontside pad silicon nitride film 300A, backside pad silicon nitride film 300B and edge 275 of wafer 260. A first protective film 280 has a backside outer surface 285 where the first protective film is formed on backside pad silicon nitride film 300B.

Figure 3D:
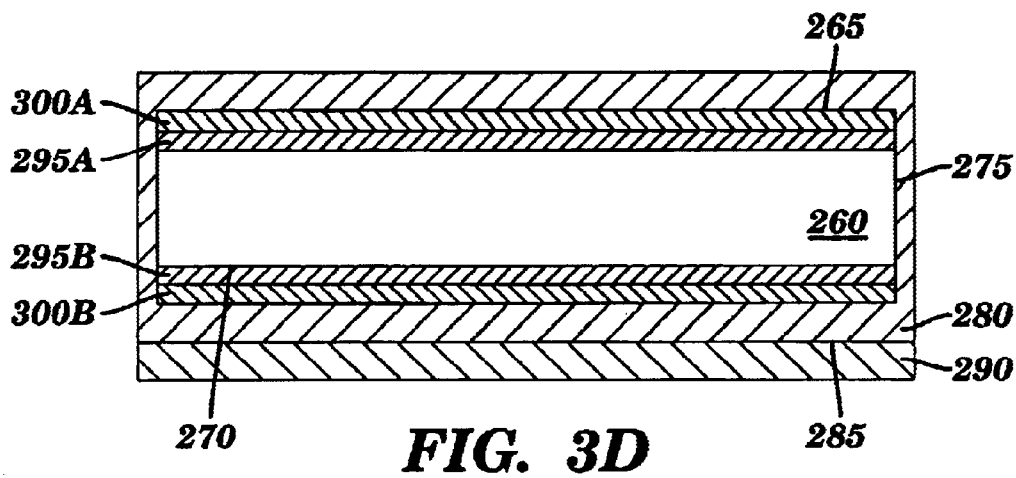

In FIG. 3D, a second protective film 290 is formed on backside outer surface 285 of first protective film 280. In one example, first protective film 280 is TEOS oxide about 50 Å to 7000 Å thick formed by any number of well known CVD processes and second protective film 290 is silicon carbide about 350 Å to 5000 Å thick formed only on backside outer surface 185 of first protective film 280 using a tool/process such as AMAT Producer for BLOK by AMAT, Santa Clara, Calif. A thermal oxide may be substituted for TEOS.

Figure 3E:
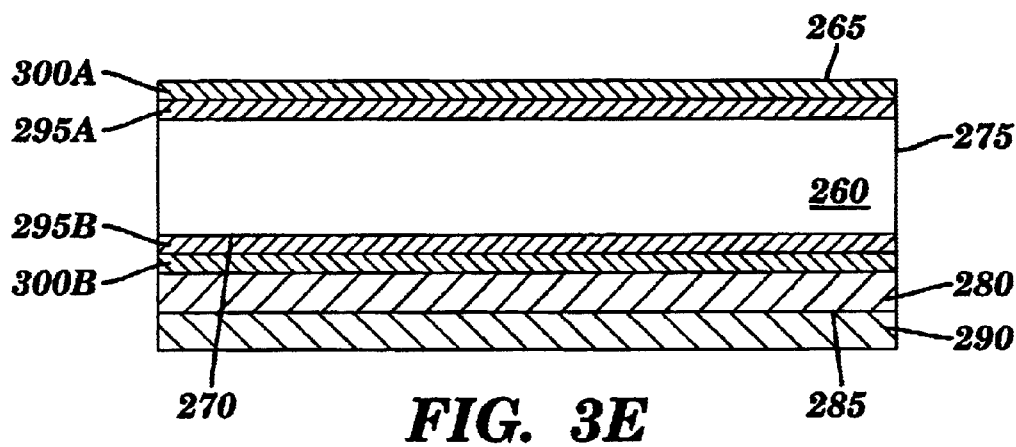

In FIG. 3E, first protective film 280 is removed from frontside pad silicon nitride film 300A and edge 275 of wafer 260 by etching in dilute HF. At this point, one or more wafer processing steps may be performed as illustrated in FIG. 1 and described in step 125 above.

First protective film 280 protects frontside 265 of wafer 260 from mechanical damage during formation of second protective film 290. Second protective film protects backside 270 of wafer 260 from mechanical damage and acts as a diffusion barrier. Since silicon carbide and diamond are impervious to nearly all standard semiconductor wet etches, first protective film 280 sandwiched between second protective film 290 and backside 270 of wafer 260 is maintained during wafer process steps such as HF etches. The presence of first protective film 280 sandwiched between second protective film 290 and backside 270 of wafer 260 minimizes wafer charging. Second protective film 290 may removed by mechanical means such as CMP or grinding.

Figure 4A:
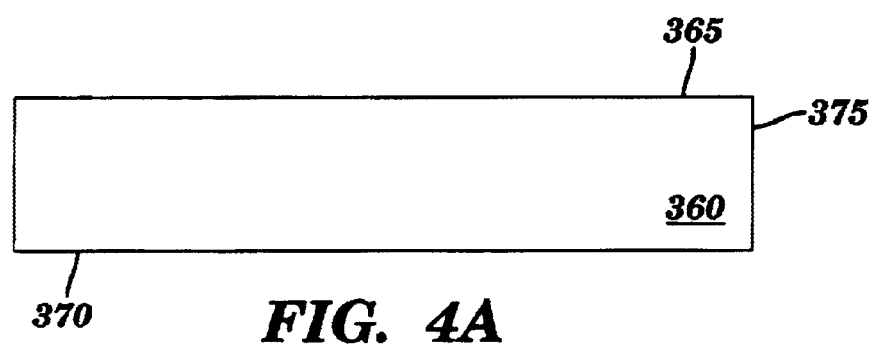
FIGS. 4A through 4D are cross-sectional views of a third example of the present invention.

FIGS. 4A through 4D are cross-sectional views of a third example of the present invention. In FIG. 4A, a bare semiconductor substrate wafer 360 has a frontside 365, a backside 370 and an edge 375.

Figure 4B:
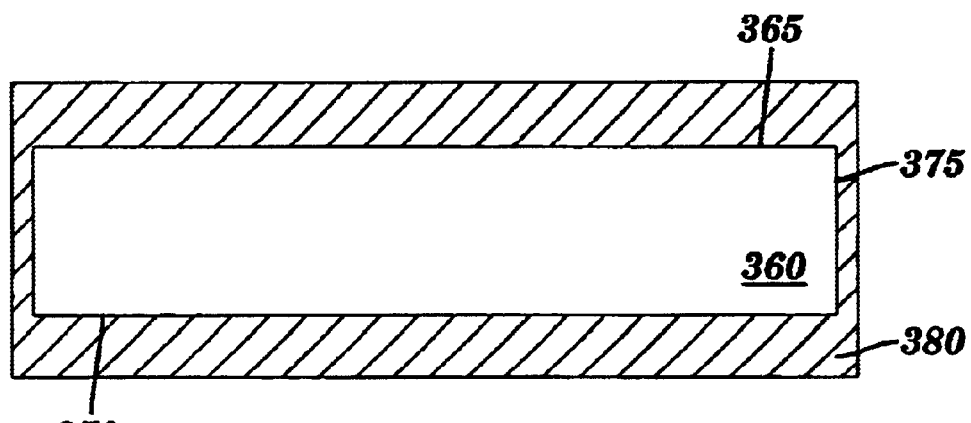

In FIG. 4B, a protective film 380 is formed on frontside 365, backside 370 and edge 375 of wafer 360. In one example, protective film 380 is a thick silicon oxide formed by any number of well known oxidation or deposition methods. Protective film 380 has a thickness "T1." The thickness of protective film 380 depends upon the number and length of oxide etching process steps to which wafer 360 will be subjected. The thickness of protective film 380 is chosen such that about 1000 Å to 5000 Å of silicon oxide remains after wafer processing. Depending upon the processes from which backside 370 of wafer 360 is to be protected, protective film 380 may also be formed from silicon nitride, TEOS oxide, thermal oxide or combinations thereof.

Figure 4C:
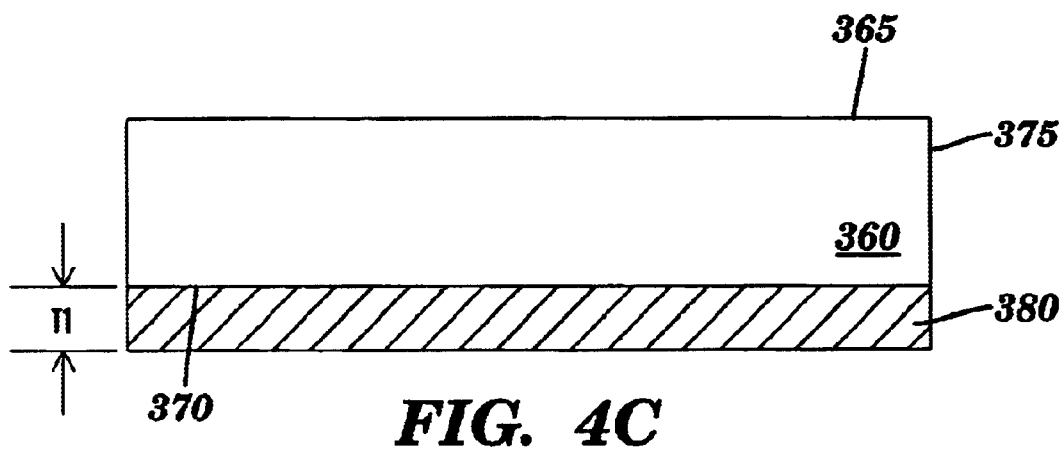

In FIG. 4C, protective film 380 is removed from frontside 365 and edge 375 of wafer 360 by wet etching or frontside CMP. At this point, one or more wafer processing steps may be performed as illustrated in FIG. 1 and described in step 125 above.

Figure 4D:
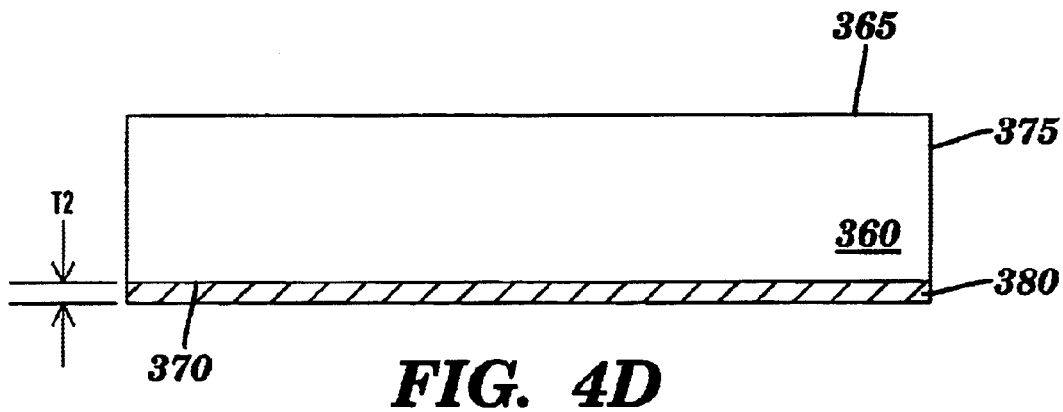

FIG. 4D illustrates the thinning of protective layer 380 during wafer processing. Thinning occurs as protective film 380 is etched by process chemicals during fabrication. In FIG. 4D, protective layer is reduced a thickness of "T2", where "T1>T2."

Protective film 380 protects backside 370 of wafer 360 from mechanical damage and acts as a diffusion barrier.

Figure 5A:
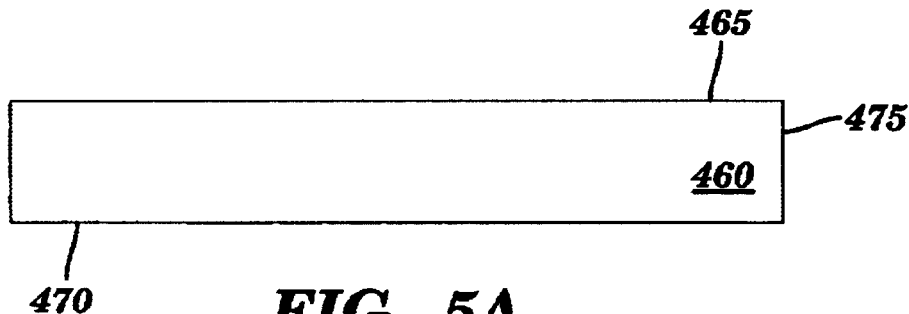
FIGS. 5A through 5E are cross-sectional views of a fourth example of the present invention.

FIGS. 5A through 5E are cross-sectional views of a fourth example of the present invention. In FIG. 5A, a bare semiconductor substrate wafer 460 has a frontside 465, a backside 470 and an edge 475.

Figure 5B:
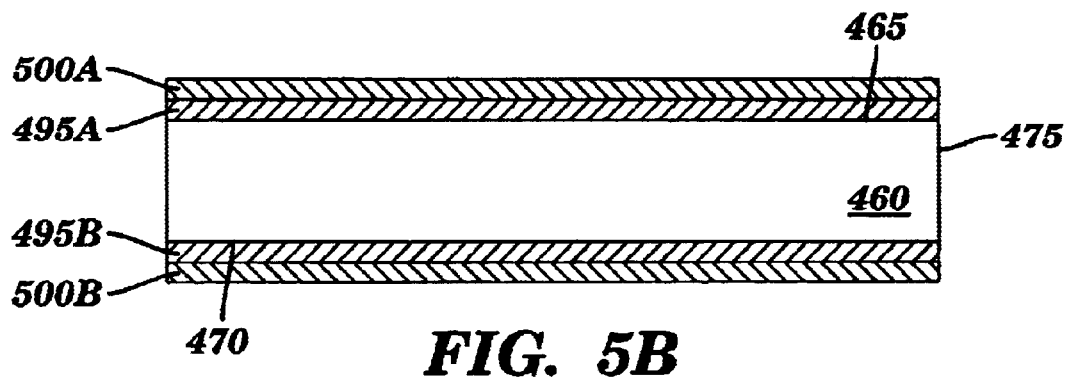

In FIG. 5B, one or more process films are formed on wafer 460. In one example, the process films comprise frontside pad oxide film 495A formed on frontside 465 and backside pad oxide film 495B formed on backside 470 of wafer 460 and frontside pad silicon nitride film 500A formed on frontside pad oxide film 495A and backside pad silicon nitride layer 500B formed on backside pad oxide film 495B. Frontside and backside pad oxide films 495A and 495B are about 50 Å to 150 Å thick and may be formed by any number of well-known CVD processes. Frontside and backside pad silicon nitride films 500A and 500B are about 700 Å to 1800 Å thick and may be formed by any number of well-known CVD processes.

Figure 5C:
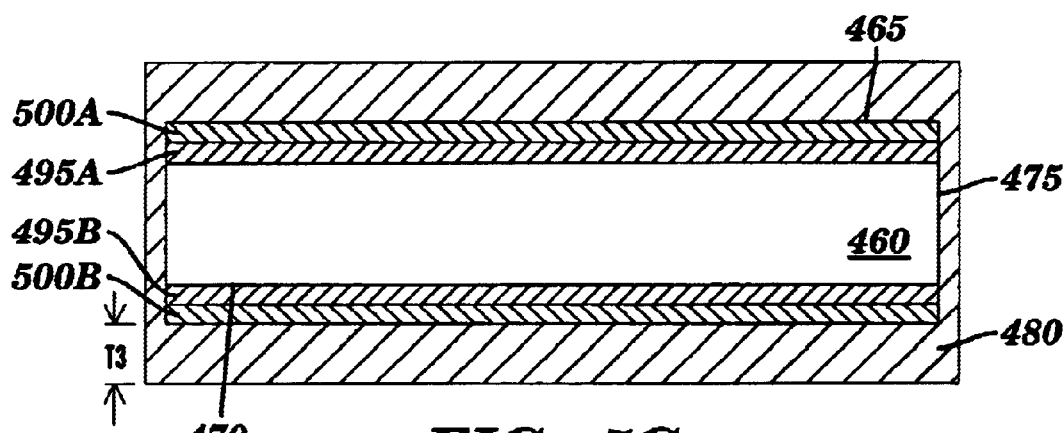

In FIG. 5C, a protective film 480 is formed on frontside pad silicon nitride film 500A, backside pad silicon nitride film 500B and edge 475 of wafer 460. In one example, protective film 480 is a TEOS oxide formed by any number of well known CVD processes. Protective film 480 has a thickness "T3." The thickness of protective film 480 depends upon the number and length of etching process steps to which wafer 460 will be subjected. The thickness of protective film 480 is chosen such that about 1000 Å to 5000 Å of TEOS oxide remains after wafer processing. Depending upon the processes from which backside 470 of wafer 460 is to be protected, protective film 480 may also be formed from polysilicon.

Figure 5D:
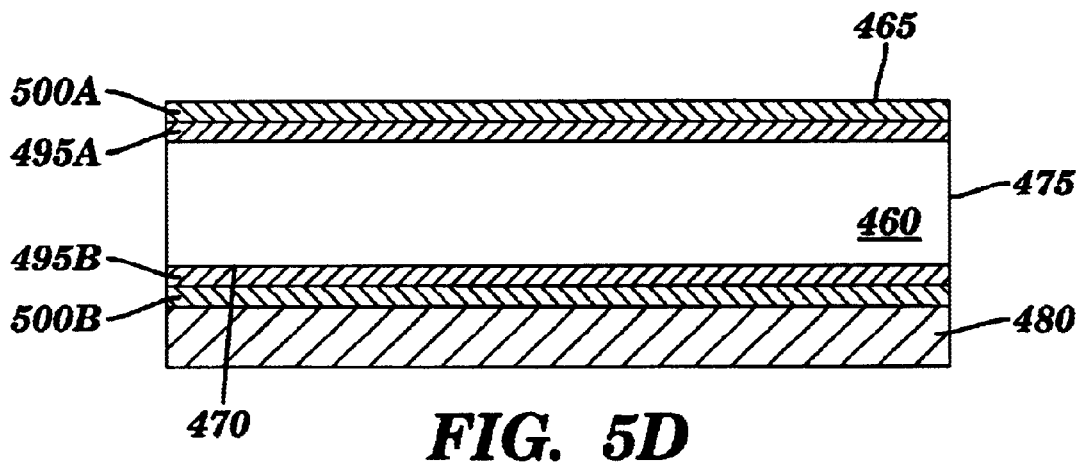

In FIG. 5D, protective film 480 is removed from frontside 465 and edge 475 of wafer 460 by wet etching or frontside CMP. At this point, one or more wafer processing steps may be performed as illustrated in FIG. 1 and described in step 125 above.

Figure 5E:
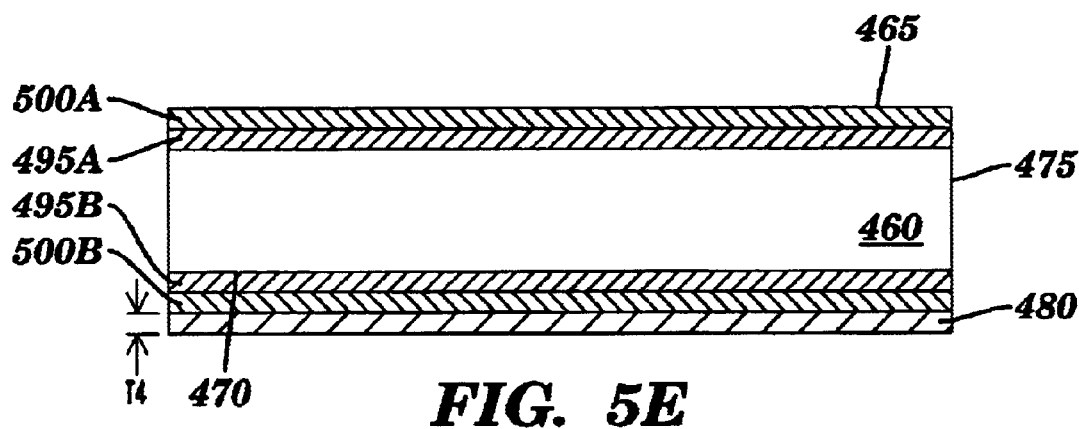

FIG. 5E illustrates the thinning of protective layer 480 during wafer processing. Thinning occurs as protective film 480 is etched by process chemicals during fabrication. In FIG. 5E, protective layer is reduced to a thickness of "T4", where "T3>T4."

Protective film 480 protects backside 470 of wafer 460 from mechanical damage and acts as a diffusion barrier.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, instead of one or two protective films, three or more may be employed. Therefore it is intended that the following claims cover all such modifications and changes as fall within the true spirit and scope of the invention.

What is claimed is:

1. A method of fabricating a semiconductor device, comprising the following method steps in the order recited:

(a) providing a bare semiconductor substrate, said substrate having a frontside and a backside;

(b) forming two or more protective films on said backside and said frontside of said semiconductor substrate;

(c) entirely removing all protective films from said frontside of said semiconductor substrate; and (d) performing one or more wafer fabrication steps.

2. The method of claim 1, further comprising repeating steps (b), (c) and (d) one or more times.

3. The method of claim 1, wherein one of said protective films getters contaminants or particles and is removed.

4. The method of claim 1, wherein at least one of said protective films is thinned by said wafer fabrication steps.

5. The method of claim 1, wherein said protective films are selected from the group consisting of silicon carbide, diamond, diamond over silicon carbide, diamond over silicon nitride, diamond over silicon and combinations thereof.

6. The method of claim 1 further including the step of forming one or more process films on said frontside and said backside of said semiconductor substrate before step (b).

7. A method of fabricating a semiconductor device, comprising the following method steps in the order recited:

(a) providing a bare semiconductor substrate, said substrate having a front surface and a back surface;

(b) forming a protective film in direct mechanical contact with said front surface and said back surface of said semiconductor substrate, said protective film including materials selected from the group consisting of silicon carbide, diamond, diamond over silicon carbide, diamond over silicon nitride, diamond over silicon and combinations thereof;

(c) entirely removing said protective film from said front surface of said semiconductor substrate; and (d) performing one or more wafer fabrication steps.

8. The method of claim 7, further including after step (d):

(e) removing said protective film from said back surface of said semiconductor substrate.

9. The method of claim 7 further including repeating steps (b), (c) and (d) one or more times.

10. The method of claim 7, wherein said protective film getters contaminants or particles and is removed.

11. The method of claim 7, wherein said protective film is thinned by said wafer fabrication steps.

12. The method of claim 7 further including the step of forming one or more process films on said front surface and said back surface of said semiconductor substrate before step (b).

13. A method of fabricating a semiconductor device, comprising the following method steps in the order recited:

(a) providing a bare semiconductor substrate, said semiconductor substrate having a front surface and a back surface;

(b) forming a first protective film in direct mechanical contact with said front surface and said back surface of said semiconductor substrate;

(c) forming a second protective film in direct mechanical contact with said first protective film;

(d) entirely removing said second protective film from that portion of said first protective film that is on said front surface of said semiconductor substrate and entirely removing said first protective film from said front surface of said semiconductor substrate; and (e) performing one or more wafer fabrication steps.

14. The method of claim 13, further including after step (e):

(f) removing said second protective film from that portion of said first protective film that is on said back surface of said semiconductor substrate.

15. The method of claim 13, further including after step (e):

(f) removing said second protective film from that portion of said first protective film that is on said back surface of said semiconductor substrate and entirely removing said first protective film from said back surface of said semiconductor substrate.

16. The method of claim 13, further comprising repeating steps (b), (c), (d) and (e) one or more times.

17. The method of claim 13, wherein said second protective films getters contaminants or particles and is removed.

18. The method of claim 13, wherein at said second protective film is thinned by said wafer fabrication steps.

19. The method of claim 13, wherein:

said first protective film is selected from the group consisting of TEOS oxide, thermal oxide, silicon nitride and combinations thereof; and said second protective film is selected from the group consisting of silicon carbide, diamond, diamond over silicon carbide, diamond over silicon nitride, diamond over silicon and combinations thereof.

20. The method of claim 13 further including the step of forming one or more process films on said front surface and said back surface of said semiconductor substrate before step (b).

* * * * *